(12) United States Patent
Iwasawa

(10) Patent No.: US 6,770,889 B2
(45) Date of Patent: *Aug. 3, 2004

(54) METHOD OF CONTROLLING ELECTROSTATIC LENS AND ION IMPLANTATION APPARATUS

(75) Inventor: Koji Iwasawa, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/370,608

(22) Filed: Feb. 24, 2003

(65) Prior Publication Data

US 2003/0151004 A1 Aug. 14, 2003

Related U.S. Application Data

(63) Continuation of application No. 09/708,488, filed on Nov. 9, 2000, now Pat. No. 6,614,027.

(30) Foreign Application Priority Data

Nov. 12, 1999 (JP) ..................................... P. 11-322510

(51) Int. Cl.$^7$ .............................. G01K 1/08; H01S 3/14
(52) U.S. Cl. ....................... 250/398; 250/310; 250/311; 250/396 R; 250/397; 250/399; 250/492.21
(58) Field of Search ................................ 250/398, 397, 250/396 R, 310, 311, 492.21, 492.3

(56) References Cited

FOREIGN PATENT DOCUMENTS

| | | |
|---|---|---|
| GB | 2311 650 A | 1/1997 |
| JP | 05 166486 | 7/1993 |
| JP | 8-115701 A | 5/1996 |
| JP | 8-273895 | 10/1996 |
| JP | 8 274040 | 10/1996 |
| JP | 9-55179 A | 2/1997 |
| JP | 11-126576 | 11/1999 |

OTHER PUBLICATIONS

Notification of Reasons for Refusal, along with English translation, proposed date Nov. 28, 2002 (7 pages).

United Kingdom Search Report for GB Application No. 0027469.6 dated May 30, 2001.

Primary Examiner—John R. Lee
Assistant Examiner—Kalimah Fernandez
(74) Attorney, Agent, or Firm—Finnegan, Henderson, Farabow, Garrett & Dunner, L.L.P.

(57) ABSTRACT

The ion implantation apparatus deals with an ion beam as a charged particle beam and has an accelerating tube 8 incorporating an electrostatic lens for converging/diverging it. The control of the electrostatic lens is carried out as follows. The swept ion beam 4 is received by a single Faraday cup 46 to measure the beam quantity I(n) and the beam width WD(p) of the ion beam 4. The evaluated values of the beam quantity and beam width with respect to prescribed standards are calculated. These evaluated values are assigned weights to calculate a unified evaluated value. The focusing voltage Vf applied to the electrostatic lens with the accelerating tube 8 is controlled so that the unified evaluated value is increased. A waveform shaping controller 50 and beam controller 54 constitute a device for making such control.

10 Claims, 7 Drawing Sheets

METHOD OF CONTROLLING ELECTROSTATIC LENS AND ION IMPLANTATION APPARATUS

This is a continuation of application Ser. No. 09/708,488, filed Nov. 9, 2000, now U.S. Pat. No. 6,614,027 which is incorporated herein by reference.

BACKGROUND OF THE INVENTION

1. Field of the Invention

This invention relates to a method of controlling an electrostatic lens, which is used in an apparatus which converges/diverges a charged particle beam such as an ion beam, electron beam, etc. by an electrostatic lens and sweep it in an electromagnetic field to be applied onto an object-to-be-irradiated (e.g. an ion implantation apparatus and an electron microscope), and such an ion implantation apparatus for performing the controlling method. More particularly, this invention relates to a means for preventing the beam current of the swept charged particle beam from becoming smaller than before control by the electrostatic lens by performing the control taking the size of the charged particle beam in a scanning direction in consideration.

2. Description of the Related Art

An ion beam is one of charged particle beams. FIG. 4 shows an example of an ion implantation apparatus equipped with an electrostatic lens for converging or diverging the ion beam. FIG. 5 shows an enlarged main part thereof.

The ion implantation apparatus as shown is basically the same as that disclosed in Japanese Patent Unexamined Publication No. Hei. 8-115701 (JP-A-8-115701), and is directed to a so-called hybrid parallel scanning system which sweeps an ion beam in reciprocation/parallel in an X-direction (e.g. horizontal direction) and drives an object-to-be-irradiated (e.g. wafer) 22 in reciprocation in a Y direction (e.g. vertical direction) substantially orthogonal to the X direction.

The ion implantation apparatus includes an ion source 2 for deriving the ion beam 4, a mass analysis magnet 6 for selectively acquiring a specific ion species from the ion beam 4 derived from the ion source 2, an accelerating tube 8 for accelerating or decelerating the ion beam 4 acquired from the mass analysis magnet 6, a trimming Q lens 10 for removing the unnecessary part of the ion beam acquired from the accelerating tube 8, an energy analysis magnet 12 for selectively acquiring an ion with specific energy from the ion beam 4 derived from the trimming Q lens 10, a sweeping magnet 14 for sweeping the ion beam 4 derived from the energy analysis magnet 12 in the X direction by a magnetic field in this example, and a paralleling magnet 16 for bending the ion beam 4 derived from the sweeping magnet 14 again to parallel-sweep the ion beam 4 in cooperation with the sweeping magnet 14, i.e. making a parallel ion beam 4.

The ion beam 4 derived from the paralleling magnet 16 is applied to the object-to-be-irradiated 22 held in a holder 20 of a scanning mechanism 18 and ions are implanted into the object-to-be-irradiated 22. In this case, the object-to-be-irradiated 22 is driven reciprocatively in the Y direction by the scanning mechanism 18. Cooperation of the reciprocating driving of the object-to-be-irradiated 22 and sweeping of the ion beam 4 realizes uniform ion implantation into the entire surface of the object-to-be-irradiated 22.

As shown in FIG. 5, upstream and downstream of the object-to-be-irradiated 22, a front Faraday unit 36 and a back Faraday unit 44 are arranged for measurement of the ion beam 4 and shaping of the sweeping waveform thereof. The front Faraday unit 36 includes a front Faraday array 38 consisting of a plurality of Faraday cups 40 aligned in the X direction which is the scanning direction of the ion beam 4. A back Faraday array 44 consists of a plurality of Faraday cups 46 aligned in the X direction. It should be noted that the front Faraday unit 36 is vertically moved to positions which correspond to the ion implantation into the object-to-be-irradiated 22 and the measurement by the front Faraday array 38, respectively. At the time of measurement by the back Faraday array, the holder 20 is moved out of the way.

The front Faraday array 38 and back Faraday array 44 are basically the same as those disclosed in Japanese Patent Unexamined Publication No. Hei. 9-55179 (JP-A-9-55179). The beam currents measured by these elements are taken into a waveform shaping controller 50 via a current transducer 48 which is a current measuring means. The waveform shaping controller 50, for example, performs the same control as disclosed in e.g. the above JP-A-9-55179. Namely, in short, the waveform shaping controller 50 creates a sweeping signal S(t) which causes the sweeping speed of the ion beam 4 on the object-to-be-irradiated 22 to approach a constant value. This signal is a function of time t. A sweeping power source 52 amplifies a sweeping signal S(t) into a sweeping current J(t), the sweeping current J(t) is supplied to the sweeping magnet 14 for its driving. In the present invention, it is to be understood that various changes and modifications may be made without restricting to the above control of JP-A-9-55179.

Meanwhile, it is necessary to implant the object-to-be-irradiated 22 with ions having desired energy and belonging to desired species by a desired quantity at substantially prescribed ion-implanting time.

The ion species are selected using the above mass analysis magnet 6 and energy analysis magnet 12. The ion energy is determined using a power source (not shown) for the ion source 2 and/or an acceleration/deceleration power source (acceleration/deceleration power source 32 in FIG. 6) for the accelerating tube 8. The quantity of ion implantation is controlled using the current value of the swept beam (current value of the swept ion beam 4) measured by a dose Faraday 42 attached to the front Faraday unit 36.

In order to carry out the ion implantation processing at a scheduled implanting time, the swept-beam current value of the ion beam which is to be applied to the object-to-be-irradiated 22 must be set at a prescribed value calculated from a necessary quantity of implantation and a scheduled implanting time.

A means for realizing this is a technique of controlling an electrostatic lens for converging/diverging a charged particle beam (ion beam 4 in the example) by an electric field or magnetic field. Generally, such an electrostatic lens is used to increase the swept beam current obtained at the position of the object-to-be-irradiated.

In this example, the electrostatic lens incorporated in the accelerating tube 8 is controlled. This technique will be mainly explained below. Incidentally, the technique of controlling the trimming Q lens 10 which is a four-pole type magnetic lens can be adopted.

The accelerating tube 8 shown in FIG. 6 is basically the same as that disclosed in Japanese Patent Unexamined Publication No. Hei. 8-273895 (JP-A-8-273895). The accelerating tube 8 is directed to a two-gap three-pole type. The accelerating tube 8 has a structure in which a high voltage side electrode 26 and ground side electrode 28 are arranged within an insulator 24 and a focusing electrode 30 is arranged between both electrodes 26 and 28. A voltage for acceleration or deceleration is applied between both electrodes 26 and 28 from an acceleration/deceleration power source 32. A focusing voltage Vf is applied between the high voltage side electrode 26 and the focusing electrode 30 from the focusing power source 34. Both power sources 32 and 34 can control the output voltage individually and independently. The electric field created among the three electrodes 26, 30 and 28 serves as an electrostatic lens for converging or diverging the ion beam 4. Therefore, an electrostatic lens is incorporated in the accelerating tube 8.

Mainly referring to FIG. 5, an explanation will be given of a conventional method of increasing the swept beam current obtained at a position of the object-to-be-irradiated 22 in such a manner of controlling the electrostatic lens incorporated in the accelerating tube 8.

All the plurality (e.g. 11) of the Faraday caps 46 constituting the back Faraday 44 are connected in parallel to the current transducer 48. In this state, the focusing voltage Vf which is an output from the focusing power source 34 is varied to alter the potential of the focusing electrode 30. Therefore, the status of converging or diverging of the ion beam 4 at the electrostatic lens within the accelerating tube 8 is changed and thereby the rate of the ion beam 4 lost during transportation is also changed. Thus, the relationship between the beam current measured by the current transducer 48 and the focusing voltage Vf exhibits a hill shape as shown in FIG. 7. In this case, a focusing voltage $Vf_{max}$ giving the maximum beam current is selected as a solution and the focusing voltage Vf is set at this value. Thus, the control is completed.

In the control method as described above, by varying the focusing voltage Vf, (1) the rate of the ion beam 4 lost during the transportation varies so that the beam current at the position of the object-to-be-irradiated varies and (2) the diverging angle of the ion beam after having passed the electrostatic lens varies so that the size (geometrical size) of the ion beam 4 at the position of the object-to-be-irradiated 22 also varies.

The purpose of controlling the focusing voltage Vf is to acquire a large quantity of swept beam current at the position of the object-to-be-irradiated 22. If the effect obtained by the varying the focusing voltage Vf resides in only the above item (1), the above control method can achieve this purpose.

However, actually, the effect of (2) occurs simultaneously. Therefore, in the above control method, as a result of controlling the focusing voltage Vf, there is a possibility of the following case. That is, the size of the ion beam 4 at the position of the object-to-be-irradiated 22 varies so that the area to be swept by the ion beam 4 is also increased. As a result, contrary to the purpose, the swept beam current at the position of the object-to-be-irradiated 22 may become less than that before control. This will be explained in detail below.

The area to be swept by the ion beam 4 depends on the size of the object-to-be-irradiated 22 and the size of the ion beam 4. Now it is assumed that the spot shape of the ion beam 4 (i.e. sectional shape of the ion beam 4 before being swept) is a circle having a diameter d and that of the object-to-be-irradiated 22 is a circle having a diameter D. In order to make ion-implantation for the entire surface of the object-to-be-irradiated 22, the ion beam 4 must start from the state A where the ion beam 4 is not applied to the object-to-be-irradiated 22 to approach the object-to-be-irradiated 22, cross the surface of the object-to-be-irradiated 22, and finally reach the state B where the ion beam 4 is not entirely applied to the object-to-be-irradiated 22. In the return, the ion beam 4 must move similarly in the opposite direction. Generally, an over sweep quantity α is set so that the above movement can be assured even if the size of the ion beam 4 varies and the object-to-be-irradiated 22 slightly deviates from its right position.

Therefore, the width W to be swept by the ion beam 4 can be expressed by the following equation. Namely, as the spot diameter d of the ion beam 4 increases, the width W increases.

$$W=D+2\alpha+d \quad (1)$$

If the sweeping width actually by the ion beam 4 exceeds the value represented by Equation (1), the rate of the ion beam which is not applied to the object-to-be-irradiated 22 but wasted increases. Inversely, if it is too small, the ion beam 4 is not applied onto a part of the object-to-be-irradiated. Both are not desired. Therefore, after the operation which may vary the diameter d of the ion beam 4 during its set-up has been carried out, whether or not the present swept area satisfies Equation (1) is checked (this is referred to as "over-sweep check", and if necessary readjustment of the swept length (this is referred to as "sweep adjustment") is carried out.

However, when the sweeping width by the ion beam as a result of the sweep adjustment varies, the swept beam current varies. The reason therefor will be explained below.

The swept beam current means the quantity of charges Q which has entered a certain region for a unit time during scanning the ion beam 4. Generally, the quantity of charges Q which has entered any Faraday cup (e.g. any of the Faraday cups 46 shown in FIG. 5) for a unit time is taken as the swept beam current in the Faraday cup. However, now, in order to simplify the issue, the swept beam current at the object-to-be-irradiated 22 will be thought about.

A seen from FIG. 8, if the oversweep quantity α is assured sufficiently, the quantity of charges Q which enters the object-to-be-irradiated 22 per one sweeping (one round trip) of the ion beam 4 can be expressed using a spot beam current $I_{sp}$ by the following equation. Now assuming that t is a time while the ion beam is applied to the object-to-be-irradiated 22 during its half sweeping(one way) and the sweeping speed of the ion beam is v, t=D/v.

$$Q=I_{sp}\times 2t \quad (2)$$

In the apparatus described in this embodiment, the sweeping frequency of the ion beam 4 is always fixed to a constant value regardless with the sweeping width thereof. Therefore, the sweeping speed v of the ion beam 4 is a function of the sweeping width (swept area). Concretely, it can be expressed by the following Equation. It is assumed that $t_{sw}$ is a time required for one sweeping (one round trip) and takes a certain prescribed time.

$$v=2W/t_{sw} \quad (3)$$

The swept beam current I for the object-to-be-irradiated 22, which is a value obtained when the quantity of charges Q which enters the object-to-be-irradiated 22 per one scanning is divided by the time required for the one scanning, can be expressed by $$\begin{aligned}I &= Q/t_{sw} \quad (4)\\ &= I_{sp}\times 2\{D/(2W/t_{sw})\}/t_{sw}\\ &= I_{sp}\times D/W\\ &= I_{sp}\times D/(D+2\alpha+d)\end{aligned}$$

In Equation 4, any other amount than d is a constant. Therefore, in comparison in the states where Equation (1) is satisfied, as the beam diameter d increases, the swept beam current I for the object-to-be-irradiated 22 decreases.

Using these relationships, as a result that control of the focusing voltage and the subsequent sweep adjustment have been carried out, the condition for making the swept beam current I larger than that before control can be acquired.

The swept beam current I before the control can be expressed from the following Equation (5), and the swept beam current I' after the control can be expressed by the following Equation (6). After the control has been carried out, the spot beam current $I_{sp}$ varies by the action of the above item (1). The elements which will vary are appended with a dash symbol (').

$$I = I_{sp} \times D/(D+2\alpha+d) \quad (5)$$

$$I' = I_{sp}' \times D/(D+2\alpha+d') \quad (6)$$

Thus, it can be understood that the condition for making I'/I>1 is the following Equation (7)

$$(Isp'/Isp) > \{(D+2\alpha+d')/(D+2\alpha+d)\} \quad (7)$$

However, actually, Equation (7) cannot be necessarily satisfied. Also, it is not possible to know before the control whether or not Equation (7) will be satisfied. Therefore, as a result that the control of the focusing voltage and the subsequent sweep adjustment have been carried out, it happens that the swept beam current at the object-to-be-irradiated 22 becomes smaller than that before the focusing voltage control is made. In this case, although it was a purpose to obtain a large quantity of swept beam current at the object-to-be-irradiated 22, the purpose cannot be attained. It can be said that the control has ended in failure.

SUMMARY OF THE INVENTION

In view of the above circumstance, this invention mainly intends to provide a method and apparatus capable of preventing the beam current of a swept charged particle beam from becoming smaller than before control by the electrostatic lens by performing the control taking the size of the charged particle beam in a sweeping direction into consideration.

The method of controlling an electrostatic lens according to the invention is characterized by receiving a swept charged particle beam by a Faraday cup to measure a beam quantity of the charged particle beam and a beam width thereof in its sweeping direction; calculating their evaluated values with respect to their prescribed standards; assigning weights to said evaluated values to calculate their unified evaluated value; and controlling said electrostatic lens so that said unified evaluated value is increased.

The unified evaluated value is affected by not only the evaluated value of the beam quantity of the charged particle beam but also the evaluated value of the beam width which is the size in the direction of sweeping the charged particle beam. Therefore, by controlling the electrostatic lens within the accelerating tube so that the unified evaluated value is increased, both of the beam current of the swept charged particle beam and the size of the charged particle beam in the sweeping direction can be approximated to their preferable state. As a result, it is possible to prevent the beam current of the charged particle beam from becoming smaller than that before the control of the electrostatic lens.

The ion implantation apparatus according to the invention is characterized in that it comprises a Faraday cup for receiving said swept ion beam, and a controller for controlling said electrostatic lens on the basis of a measured signal sent from the Faraday cup, and in that said controller has functions of: measuring a beam quantity of the ion beam and a beam width thereof in its sweeping direction at the position of the Faraday cup; calculating their evaluated values with respect to their prescribed standards; assigning weights to said evaluated values to calculate the unified evaluated value which unifying their evaluated value; and controlling said electrostatic lens so that said unified evaluated value is increased.

Since the ion implantation apparatus comprises a controlling device having a function of implementing the method of controlling an electrostatic lens and the Faraday cap, it is possible to prevent the beam current of the swept ion beam from becoming smaller than that before the control of the electrostatic lens. Thus, the purpose of acquiring the large swept beam current can be attained more surely.

DETAILED DESCRIPTION OF THE PREFERED EMBODIMENT

Figure 1:
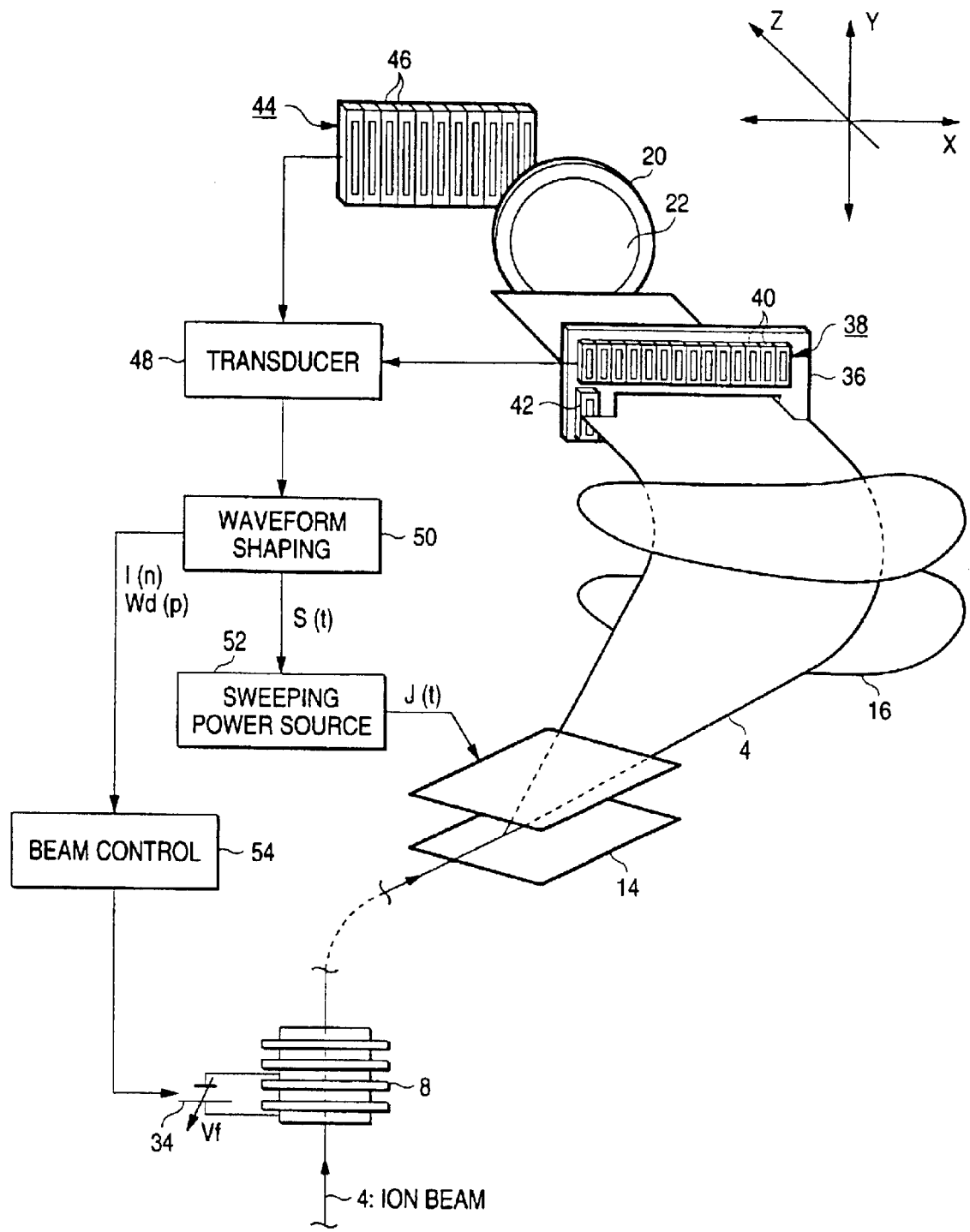
FIG. 1 is a view showing the main part of an example of the ion implantation apparatus for carrying out the control method according to the invention.
Figure 4:
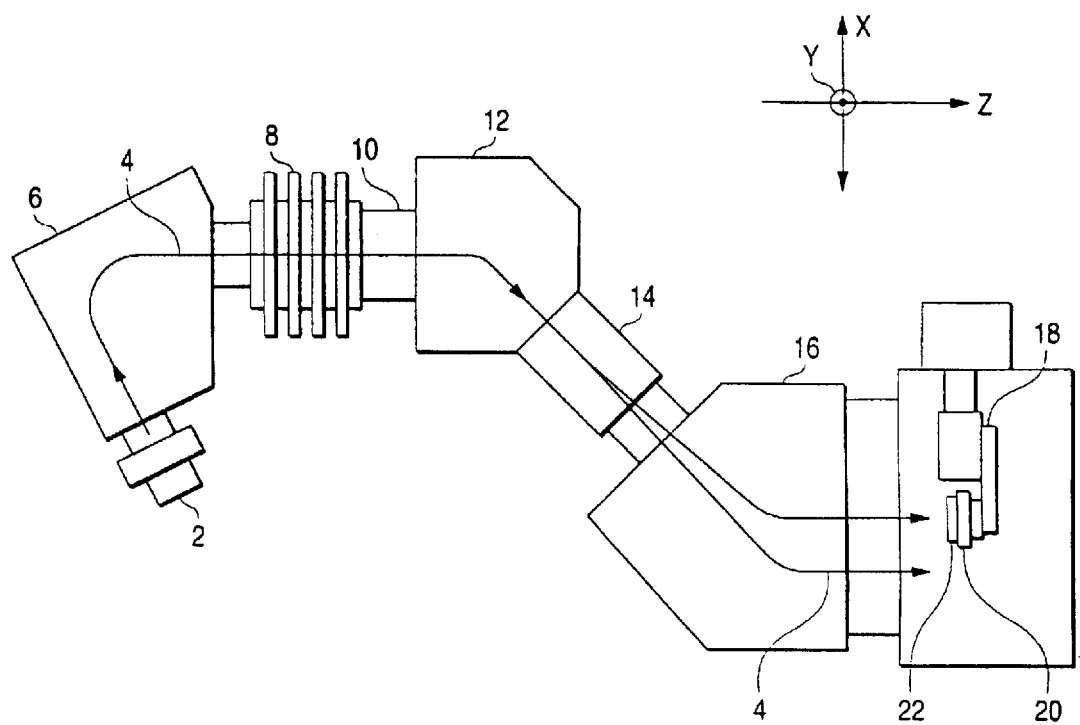
FIG. 4 is a schematic plan view showing an example of a conventional ion implantation apparatus.

FIG. 1 is a view showing the main part of an example of the ion-implantation apparatus for carrying out the control method according to the invention. The entire arrangement of the ion-implantation apparatus is such as shown in FIG. 4. Therefore, referring to this figure and the description relative thereto, the explanation will not be repeated. In the following description, like reference symbols refer to like or corresponding parts in the conventional art shown in FIGS. 4 to 6. A difference between the invention and the conventional art will be mainly explained below.

Figure 5:
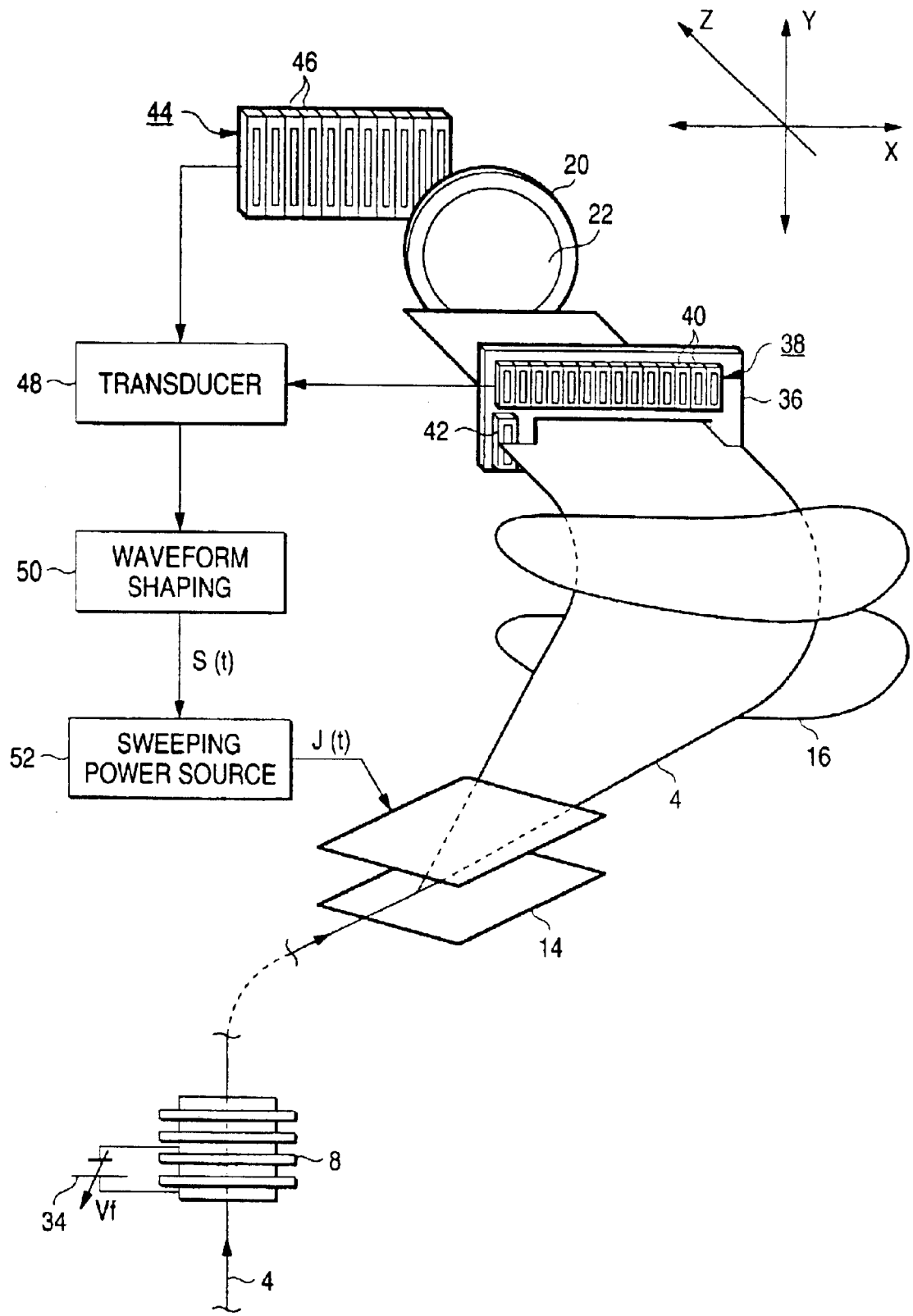
FIG. 5 is a view showing the main part of an example of a conventional ion implantation apparatus.
Figure 6:
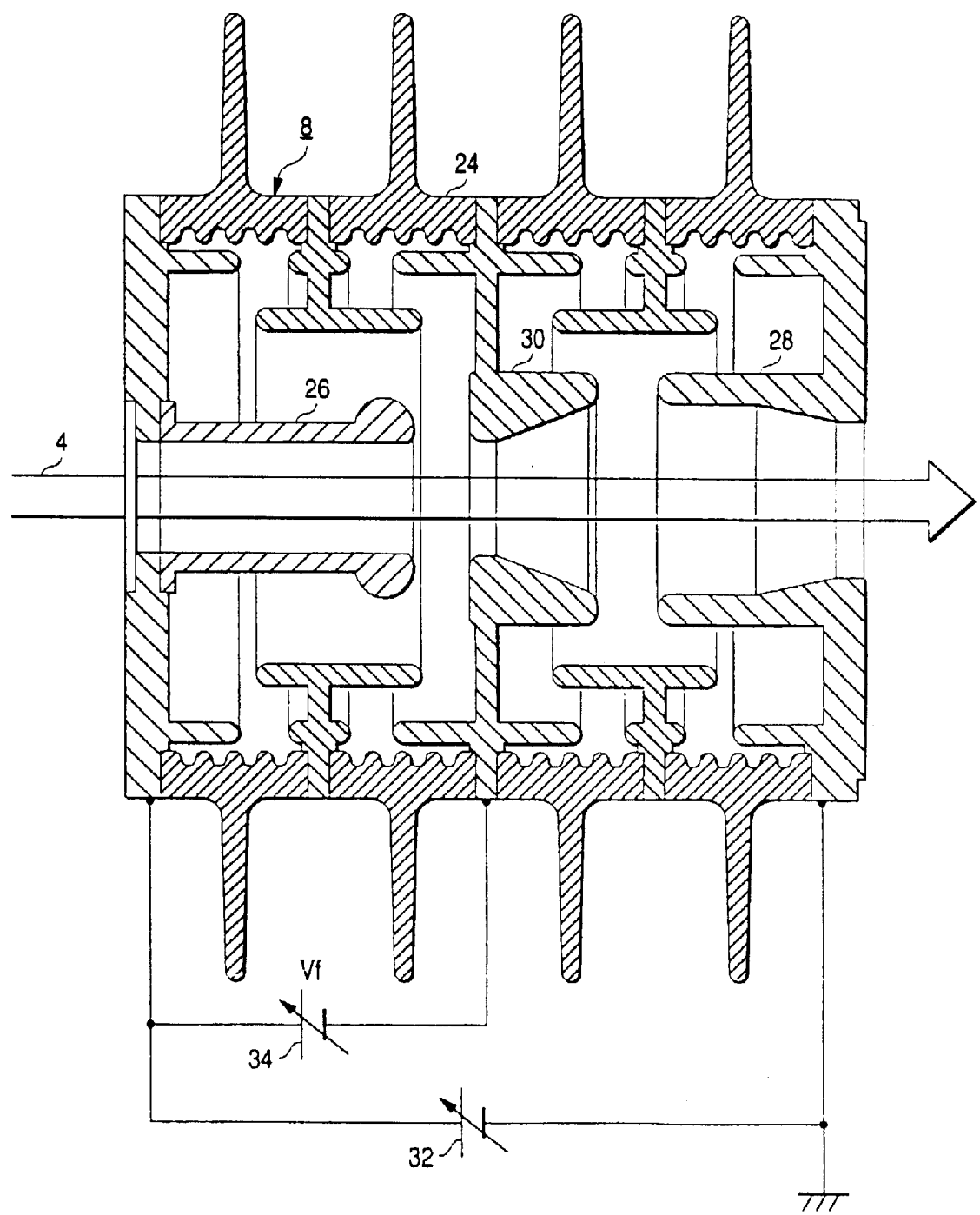
FIG. 6 is a sectional view showing an example of an accelerating tube having an electrostatic lens in FIGS. 1, 4 and 5.
Figure 7:
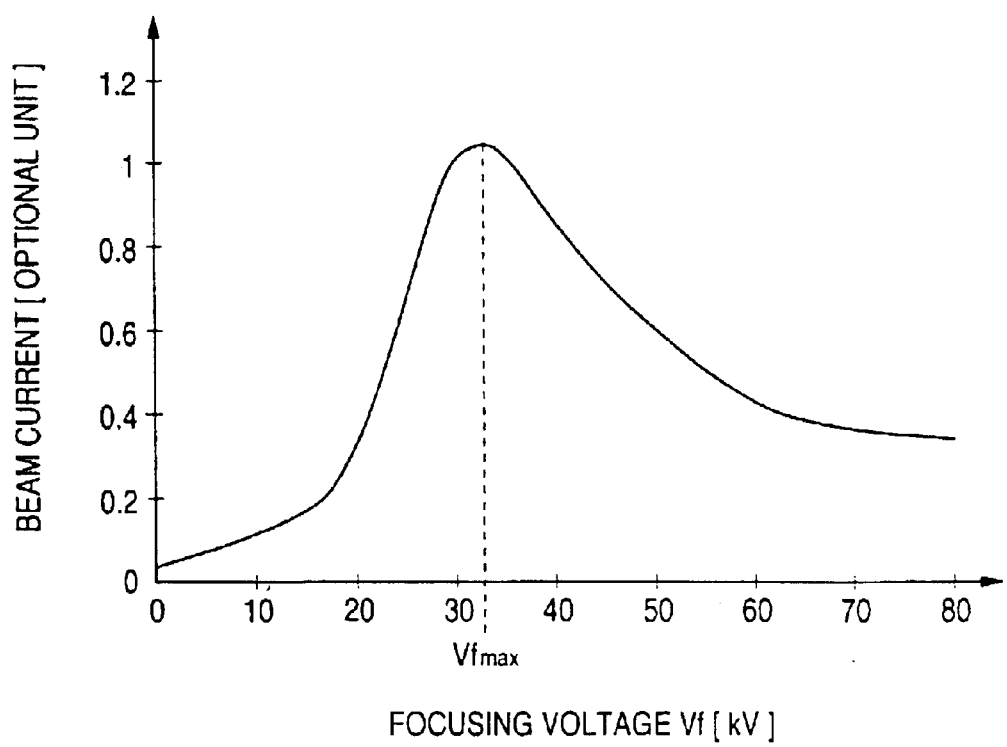
FIG. 7 is a view showing an example of the relationship between a focusing voltage and a beam current.
Figure 8:
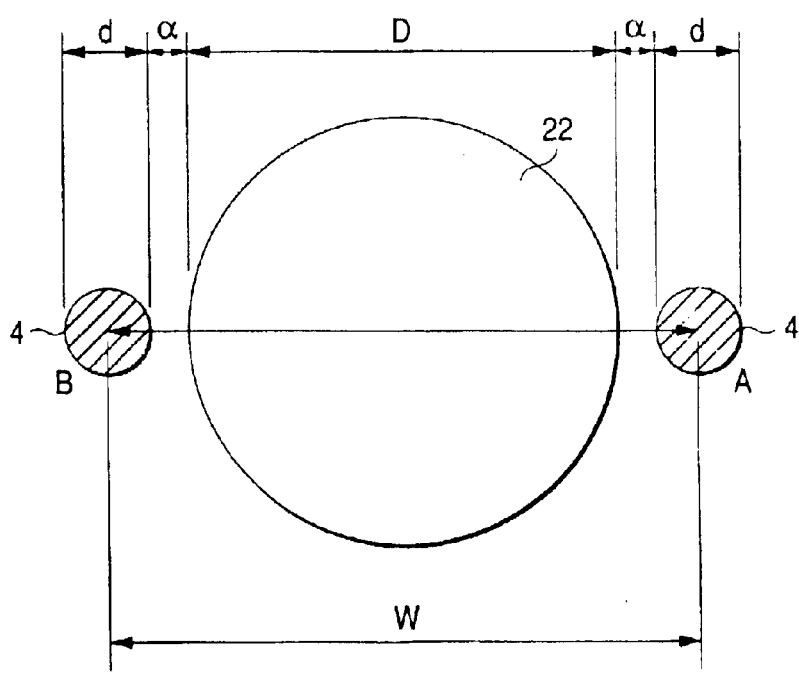
FIG. 8 is a view for explaining the necessary sweeping width of a beam.

First, a brief explanation will be given of the difference of the configuration of FIG. 1 from that of FIG. 5. In the ion implantation apparatus shown in FIG. 1, the waveform shaping controller 50 has also the function of measuring the beam quantity I(n) and beam width Wd(p). A beam controller 54 is also provided for controlling the focusing voltage Vf from the focusing power source 34 (i.e. controlling the electrostatic lens incorporated in the accelerating tube 8) on the basis of the beam quantity I(n) and beam width Wd(p).

In this example, both of the waveform shaping controller 50 and beam controller 54 constitute the controlling apparatus for controlling the electrostatic lens incorporated in the accelerating tube 8. However, both controllers may be integrated to constitute the controlling apparatus, and only the beam controller 54 can be used to constitute the controlling apparatus.

Now also referring to the flowchart of FIG. 2, a detailed explanation will be given of a method of controlling the electrostatic lens incorporated in the accelerating tube 8 using the above waveform shaping controller 50 and beam controller 54, etc.

A focusing voltage Vf (kV) which is an output from the focusing power source 34 will be varied from Vf(0) to Vf(m) in steps of $\{Vf(m)-Vf(0)\}/(m)$ (m is an integer not smaller than 1), in a state where one (e.g. located centrally) of the plurality (e.g. 11) of Faraday cups 46 constituting the back Faraday array 44 is connected to the current transducer 48 (this state is referred to as "back center"). In this state, while the ion beam 4 is swept (referred to "back center sweep"), (1) the beam quantity of the ion beam 4 and (2) the beam width of the ion beam 4 will be measured.

(1) As regards the beam quantity

Figure 2:
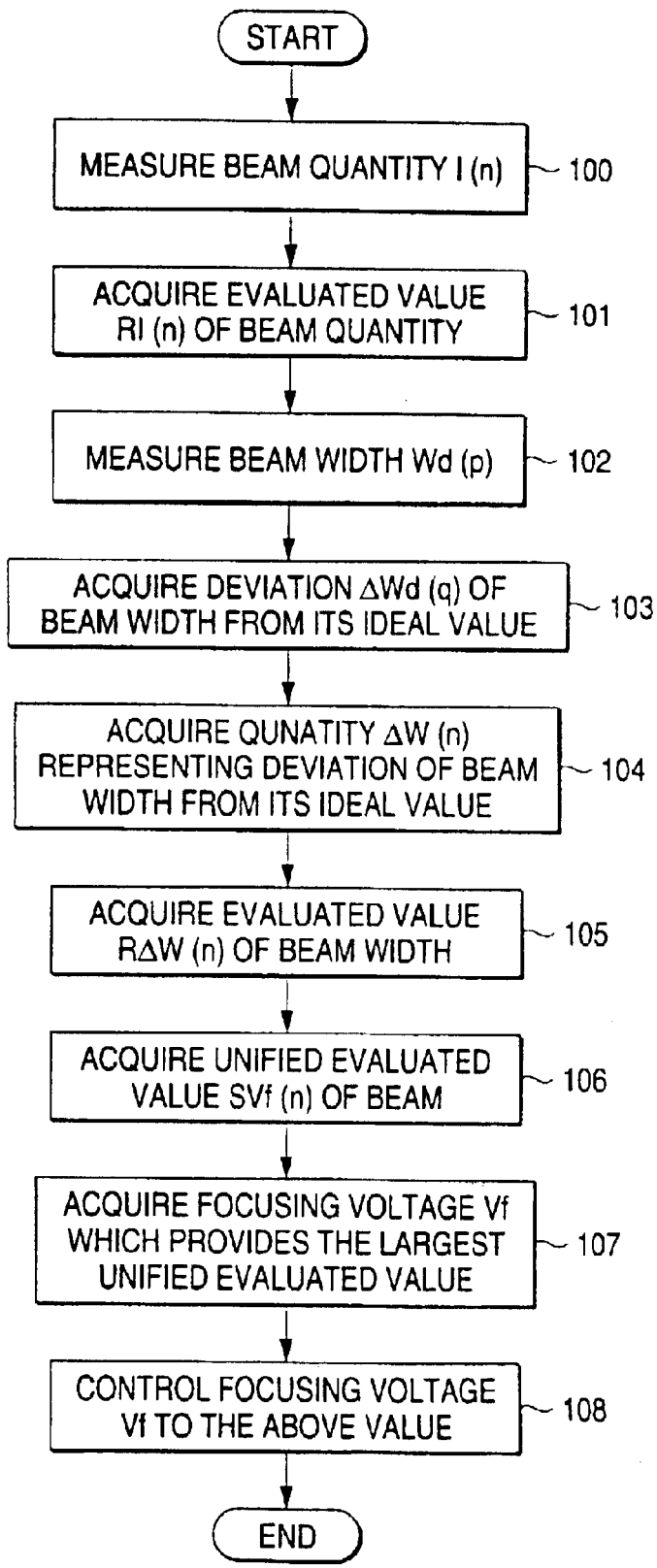
FIG. 2 is a flowchart showing an example of the control method according to the invention.
Figure 3:
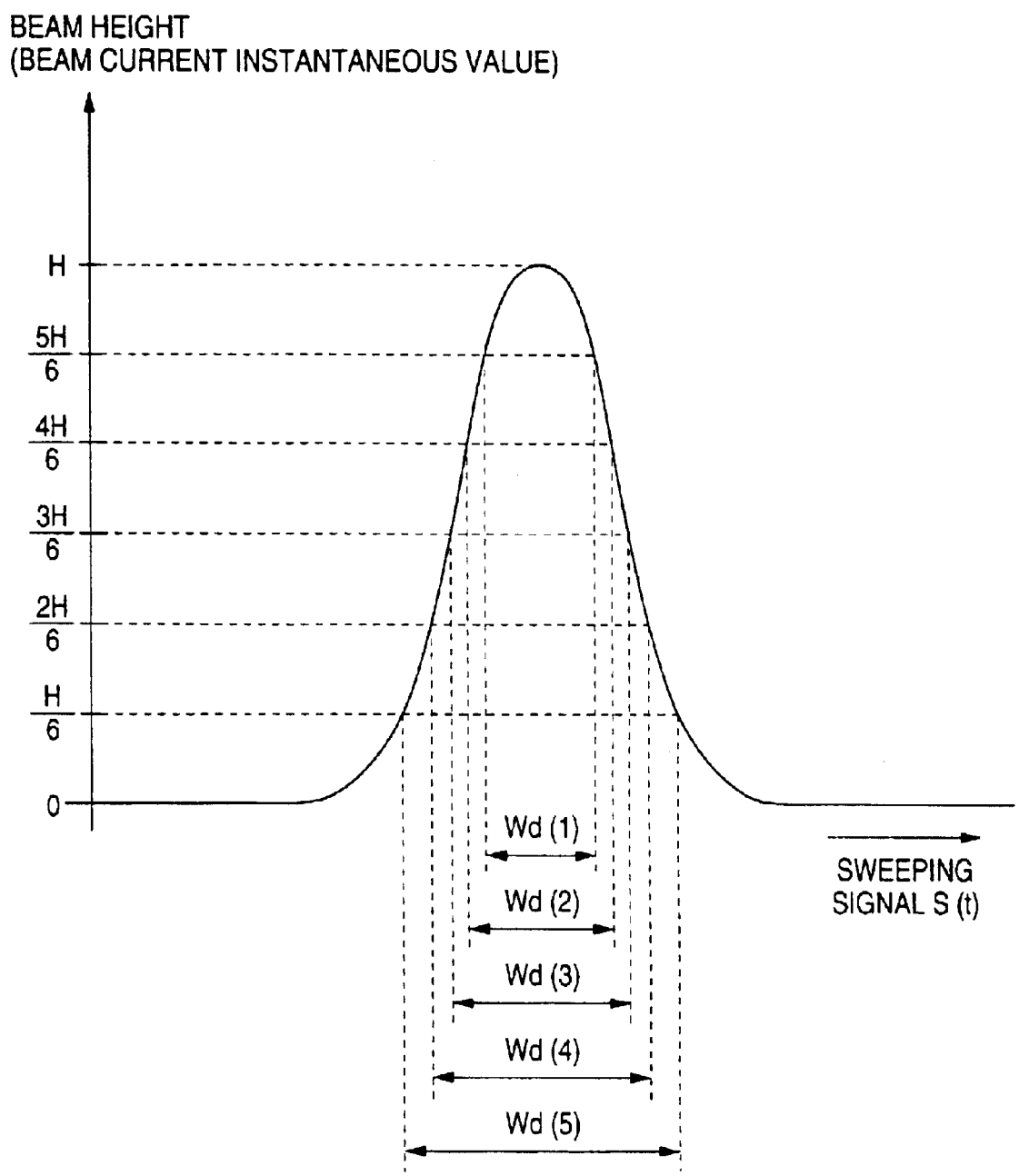
FIG. 3 is a view showing an example of a beam waveform.

At a certain focusing voltage Vf (n), the beam quantity I(n) in the "back center sweep" is measured and stored (step 100 in FIG. 2). In this example, this will be carried out by the waveform shaping controller 50, and the measured data I(n) is supplied to the beam controller 54. The beam quantity I(n) is an integrated value of the beam current instantaneous value of the beam waveform as shown in FIG. 3 and is represented by a quantity of charges. Symbol n denotes an integer of 0≦n≦m. This measurement is carried out by varying the focusing voltage Vf from Vf(0) to Vf (m) in steps of {Vf (m)−Vf (0)}/(m). Therefore, the arrangement I(n) has (m+1) elements from n=0 to n=m.

Assuming that the largest value in the elements of I(n) is $I_{max}$, the evaluated value RI(n) of the beam quantity is acquired from the following equation (step 101). In this example, this will be carried out by the beam controller 54. RI(n), which is a relative representation of In, is an arrangement having the size equal to that of I(n).

$$RI(n) = I(n)/I_{max} \quad (8)$$

(2) As regards the beam width

At a focusing voltage Vf(n), H is taken as the simple peak height of the beam waveform as shown in FIG. 3 which is acquired by the "back center sweep". The width of the beam waveform is measured in different p (p is an integer not smaller than 1) heights. The beam widths measured at the heights of pH/(p+1), (p−1)H/(p+1), . . . , 2H/(p+1), H/(p+1) are referred to Wd(1), Wd(2), . . . Wd(p) (step 102). In this example, this will be carried out by the waveform shaping controller 50, and the measured data Wd(p) is supplied to the beam controller 54. FIG. 3 shows an example in the case of p=5.

On the other hand, the ideal values of beam width at the heights of pH/(p+1), (p−1)H/(p+1), . . . , 2H/(p+1), H/(p+1) are referred to Wdi(1), Wdi(2), . . . Wdi(p). Setting of the ideal values may be varied according to a purpose of use.

However, the height and width of the above beam does not represent the geometrical height and width of the beam spot of the actual ion beam 4. Namely, the beam waveform shown in FIG. 3 is illustrated as a beam current instantaneous value in the vertical axis and the above sweeping signal S(t) in the horizontal axis. Therefore, the beam height now referred to is the beam current instantaneous value and the width at each of the heights reflects the geometrical width of the beam spot. Namely, the smaller the geometrical width of the beam spot is, the smaller the width at each of the heights is.

Next, the deviation ΔWd (q) of the beam width at each height from its ideal value is acquired from the following equation (step 103)). Symbol q is an integer of 1≦q≦p. Quantity ΔWd(q) is a zero or negative value. In this example, the processing and control from then will be entirely carried out by the beam controller 54.

$$\Delta Wd(q) = Wdi(q) - Wd(q) \quad (9)$$

(where if Wdi (q)≧Wd (q), ΔWd(q) is set to 0.)

The quantity ΔW (n) which represents the deviation of the beam width at a certain focusing voltage Vf(n) is acquired from the following equation (step 104). Since the quantity ΔWd (q) is zero or negative, the quantity ΔW (n) is also a zero or negative value.

$$\Delta W(n) = \{p/(p+1)\} \times \Delta Wd(1) + \\ \{(p-1)/(p+1)\} \times \Delta Wd(2) + \ldots + \\ \{1/(p+1)\} \times \Delta Wd(p) \quad (10)$$

Equation (10) means that the beam waveform as shown in FIG. 3 is given heavy weight at the point closer to the peak where the current value is larger.

Assuming that the largest absolute value of the elements of ΔW(n) is $\Delta W_{max}$, the evaluated value RΔW(n) of the beam width is acquired by the following equation (step 105). The quantity RΔW(n) is a relative representation of ΔW(n), and also an arrangement having the same size as that of ΔW(n). Since the quantity ΔW(n) is zero or negative, RΔW(n) is also zero or a negative value.

$$R\Delta W(n) = \Delta W(n)/\Delta W_{max} \quad (11)$$

(3) Unified evaluation of the beam and control of the focusing voltage

Using the evaluated value RI(n) of the beam quantity and the evaluated value RΔW(n) of the beam width, the unified evaluated value SVf (n) of the beam at a certain focusing voltage Vf(n) is acquired by the following equation(step 106). The unified evaluated value SVf(n) increases as the evaluated value RI(n) of the beam quantity increases. On the contrary, since the evaluated value RΔW(n) is zero or a negative value as described above, as the absolute value of the evaluated RΔW (n) increases, the unified evaluated value SVf(n) decreases. Symbol DI and DW are integers which represent weights. Both are generally 1, but may be varied according to the purpose of use.

$$SVf(n) = DI \times RI(n) + DW \times R\Delta W(n) \quad (12)$$

The focusing voltage Vf which provides the largest evaluated value SVf(n) is acquired (namely, selected as a solution) (step 107). The focusing voltage Vf produced from the focusing power source 34 is controlled to this value (step 108). Thus, the control of the electrostatic lens incorporated in the accelerating tube 8 is completed.

The unified evaluated value SVf(n) is affected by not only the evaluated value RI (n) of the beam quantity of the ion beam 4 but also the evaluated value RΔW (n) of the beam width which represents the size in the direction of sweeping the ion beam. Therefore, by controlling the electrostatic lens within the accelerating tube 8 so that the unified evaluated value SVf(n) is increased, i.e. controlling the focusing voltage Vf applied to the electrostatic lens within the accelerating tube 8, both of the beam current of the swept ion beam 4 and the size of the ion beam 4 in the sweeping direction can be approximated to their preferable state.

As a result, unlike the conventional art, it is possible to prevent the ion beam from being controlled so that the spot beam current Isp' is increased but the beam diameter d' is also increased, and hence Equation (7) cannot be satisfied. Namely, it is possible to prevent the beam current of the swept ion beam 4 from becoming smaller than that before the control of the electrostatic lens within the accelerating tube 8. Thus, the purpose of acquiring the large swept beam current can be attained more surely.

Additionally, the control may be made of converging or diverging the ion beam 4 using the trimming Q lens 10 (see FIG. 4) which is a magnetic lens. In this case, the method described above may be applied to control the trimming Q lens 10.

The method described above can be applied to the control of the other charged particle beam than the ion beam 4, i.e. the electronic beam in an electronic microscope.

This invention, which is configured described above, provided the following effects.

In accordance with the controlling method, the unified evaluated value is affected by not only the evaluated value of the beam quantity of the charged particle beam but also the evaluated value of the beam width which represents the size in the direction of sweeping the charged particle beam. Therefore, by controlling the electrostatic lens within the accelerating tube so that the unified evaluated value is increased, both of the beam current of the swept charged particle beam and the size of the charged particle beam in the sweeping direction can be approximated to their preferable state. As a result, it is possible to prevent the beam current of the charged particle beam from becoming smaller than that before the control of the electrostatic lens. Thus, the purpose of acquiring the large swept beam current can be attained more surely.

In accordance with the ion implantation apparatus, since it comprises a controlling device having a function of implementing the above controlling method and the Faraday caps, it is possible to prevent the beam current of the swept ion beam from becoming smaller than that before the control of the electrostatic lens. Thus, the purpose of acquiring the large swept beam current can be attained more surely.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A method for controlling a lens used in an apparatus for irradiating an object with a charged particle beam, comprising:

sweeping the charged particle beam by an electric field or a magnetic field;

receiving the swept charged particle beam by a Faraday cup;

measuring a beam quantity of the charged particle beam and a beam width of the charged particle beam in a sweeping direction of the charged particle beam;

calculating a beam quantity evaluated value by dividing the measured beam quantity by a maximum beam quantity value;

calculating a beam width evaluated value by dividing the difference between an ideal beam width value and the measured beam width by a maximum beam width value;

assigning weights to the beam quantity evaluated value and the beam width evaluated value to calculate a unified evaluated value; and controlling the lens so as to increase the unified evaluated value.

2. The method according to claim 1, wherein said method is effected by an ion implantation apparatus for irradiating an object with the charged particle beam.

3. The method according to claim 1, wherein said method is effected by controlling an electron beam in an electron microscope.

4. The method of claim 1, wherein controlling the lens comprises controlling an electrostatic lens.

5. The method of claim 1, wherein controlling the lens comprises controlling a magnetic lens.

6. An ion implantation apparatus for irradiating an object with an ion beam comprising:

a lens for converging or diverging the ion beam;

a sweeping unit for sweeping the ion beam passed through the lens;

a Faraday cup for receiving the swept ion beam, and a controller for controlling the lens on the basis of a measured signal sent from the Faraday cup, wherein said controller measures a beam quantity of the ion beam and a beam width of the ion beam in a sweeping direction of the ion beam at the position of the Faraday cup, calculates a beam quantity evaluated value by dividing the measured beam quantity by a maximum beam quantity, calculates a beam width evaluated value by dividing the difference between an ideal beam width value and the measured beam width by a maximum beam width value, assigns weights to the evaluated values to calculate a unified evaluated value, and controls the lens so as to increase the unified evaluated value.

7. The ion implantation apparatus of claim 6, wherein the lens is a trimming Q lens.

8. The ion implantation apparatus of claim 6, comprising an accelerating tube, wherein the lens is incorporated in the accelerating tube.

9. The ion implantation apparatus of claim 6, wherein the lens is an electrostatic lens.

10. The ion implantation apparatus of claim 6, wherein the lens is a magnetic lens.

* * * * *